(12) United States Patent
Carson et al.

(10) Patent No.: US 7,750,454 B2
(45) Date of Patent: Jul. 6, 2010

(54) STACKED INTEGRATED CIRCUIT PACKAGE SYSTEM

(75) Inventors: Flynn Carson, Redwood City, CA (US); Jong-Woo Ha, Seoul (KR); BumJoon Hong, Seoul (KR); SeongMin Lee, Seoul (KR)

(73) Assignee: STATS ChipPAC Ltd., Singapore (SG)

( * ) Notice: Subject to any disclaimer, the term of this patent is extended or adjusted under 35 U.S.C. 154(b) by 0 days.

(21) Appl. No.: 12/056,418

(22) Filed: Mar. 27, 2008

(65) Prior Publication Data
US 2009/0243073 A1 Oct. 1, 2009

(51) Int. Cl.
*H01L 23/538* (2006.01)
*H01L 21/56* (2006.01)

(52) U.S. Cl. ............... 257/686; 257/777; 257/E21.502; 257/E23.169; 438/109; 438/110

(58) Field of Classification Search ................ 257/685, 257/686, 777, 778; 438/109, 110
See application file for complete search history.

(56) References Cited

U.S. PATENT DOCUMENTS

| | | | |
|---|---|---|---|
| 6,504,241 B1 | 1/2003 | Yanagida | |
| 6,531,338 B2 | 3/2003 | Akram et al. | |
| 6,603,072 B1 | 8/2003 | Foster et al. | |
| 6,617,193 B1 | 9/2003 | Toshio et al. | |
| 6,861,288 B2 | 3/2005 | Shim et al. | |
| 7,049,692 B2 | 5/2006 | Nishimura et al. | |
| 7,242,081 B1 | 7/2007 | Lee | |
| 7,288,835 B2 * | 10/2007 | Yim et al. | 257/685 |
| 7,309,913 B2 | 12/2007 | Shim et al. | |
| 7,364,945 B2 | 4/2008 | Shim et al. | |
| 2006/0220209 A1 | 10/2006 | Karnezos et al. | |
| 2006/0220210 A1 | 10/2006 | Karnezos et al. | |
| 2007/0045796 A1 | 3/2007 | Ye et al. | |
| 2007/0278696 A1 | 12/2007 | Lu et al. | |
| 2009/0236731 A1 | 9/2009 | Shim et al. | |

\* cited by examiner

*Primary Examiner*—Sue Purvis
*Assistant Examiner*—Whitney Moore
(74) *Attorney, Agent, or Firm*—Mikio Ishimaru

(57) ABSTRACT

A stacked integrated circuit package system includes: providing a base integrated circuit package having a base encapsulation with a cavity therein and a base interposer exposed by the cavity; mounting an intermediate integrated circuit package over the base interposer, and mounting a top integrated circuit package over the intermediate integrated circuit package.

5 Claims, 4 Drawing Sheets

US 7,750,454 B2

STACKED INTEGRATED CIRCUIT PACKAGE SYSTEM

CROSS-REFERENCE TO RELATED APPLICATION(S)

The present application contains subject matter related to concurrently filed U.S. patent application Ser. No. 12/056,402. The related application is assigned to STATS ChipPAC Ltd.

The present application also contains subject matter related to U.S. patent application Ser. No. 12/040,558 filed Feb. 29, 2008. The related application is assigned to STATS ChipPAC Ltd. and the subject matter thereof is incorporated herein by reference thereto.

TECHNICAL FIELD

The present invention relates generally to an integrated circuit package system, and more particularly to a system with a stacked integrated circuit package system.

BACKGROUND ART

Electronic devices such as smart phones, personal digital assistants, location based devices, digital cameras, music players, computers, or transportation, have become an integral part of many daily activities. Key components of these electronic devices are integrated circuit devices. These tiny integrated circuits must perform during daily activities including a wide variety of environmental conditions as well as potentially damaging forces. Many and varied types of packaging, intended for protection, interconnection or mounting, have been developed for integrated circuit devices.

Integrated circuit dies are conventionally enclosed in plastic packages that provide protection from hostile environments and enable electrical interconnection between the integrated circuit die and an underlying substrate such as a printed circuit board (PCB). The elements of such a package include: a lead frame or substrate, an integrated circuit die, bonding material to attach the integrated circuit die to the lead frame or substrate, bond wires or other connectors that electrically connect pads on the integrated circuit die to the lead frame or substrate. The package can also include a plastic or other insulating material that covers the components and forms the exterior of the package.

Wafer manufacturing strives to reduce transistor or capacitor feature size in order to increase circuit density and enhance functionality. Device geometries with sub-micron line widths are so common that individual chips routinely contain millions of electronic devices. Reduced feature size has been quite successful in improving electronic systems, and continuous development is expected in the future. However, significant obstacles to further reduction in feature size are being encountered. These obstacles include defect density control, optical system resolution limits, and availability of processing material and equipment. Attention has therefore increasingly shifted to semiconductor packaging as a means to fulfill the relentless demands for enhanced system performance.

Drawbacks of conventional designs include a relatively large footprint of the package on the mounting surface of motherboard. The footprint reflects dimensions that are typically the maximum of the package, namely, the maximum x-y dimensions of the package. In applications where mounting space is at a premium, such as pagers, portable telephones, and personal computers, among others, a large footprint is undesirable. With the goal of increasing the amount of circuitry in a package, but without increasing the area of the package so that the package does not take up any more space on the circuit board, manufacturers have been stacking two or more die within a single package. Unfortunately, sufficient overlap for electrical interconnect, large footprint top packages, increased device integration, pre-testing, and interconnect lengths have plagued previous package designs.

Thus, a need still remains for a stacked integrated circuit package system to improve area and volume. In view of the ever-increasing commercial competitive pressures, along with growing consumer expectations and the diminishing opportunities for meaningful product differentiation in the marketplace, it is critical that answers be found for these problems. Additionally, the need to save costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

A stacked integrated circuit package system includes: providing a base integrated circuit package having a base encapsulation with a cavity therein and a base interposer exposed by the cavity; mounting an intermediate integrated circuit package over the base interposer, and mounting a top integrated circuit package over the intermediate integrated circuit package.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
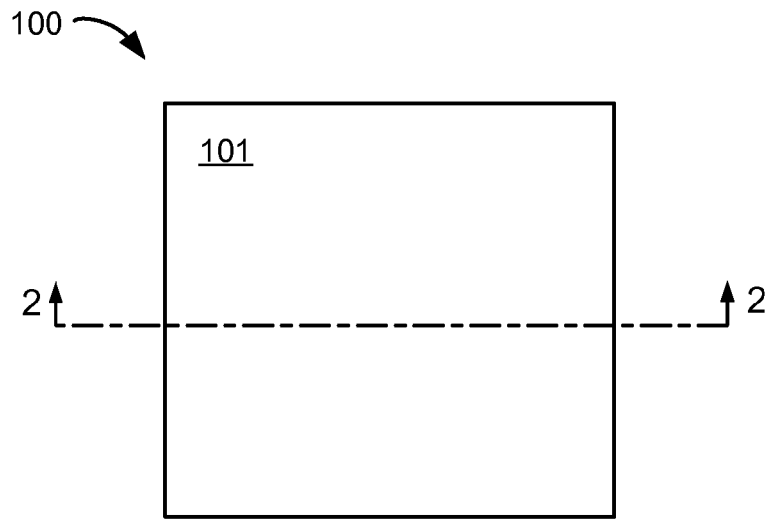
FIG. 1 is a top view of a stacked integrated circuit package system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Generally, the invention can be operated in any orientation.

In addition, where multiple embodiments are disclosed and described having some features in common, for clarity and ease of illustration, description, and comprehension thereof, similar and like features from one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Referring now to FIG. 1, therein is shown a top view of a stacked integrated circuit package system 100 in a first embodiment of the present invention. The top view depicts a top package encapsulation 101, such as a cover including an epoxy molding compound. The top package encapsulation 101 is optional.

Figure 2:
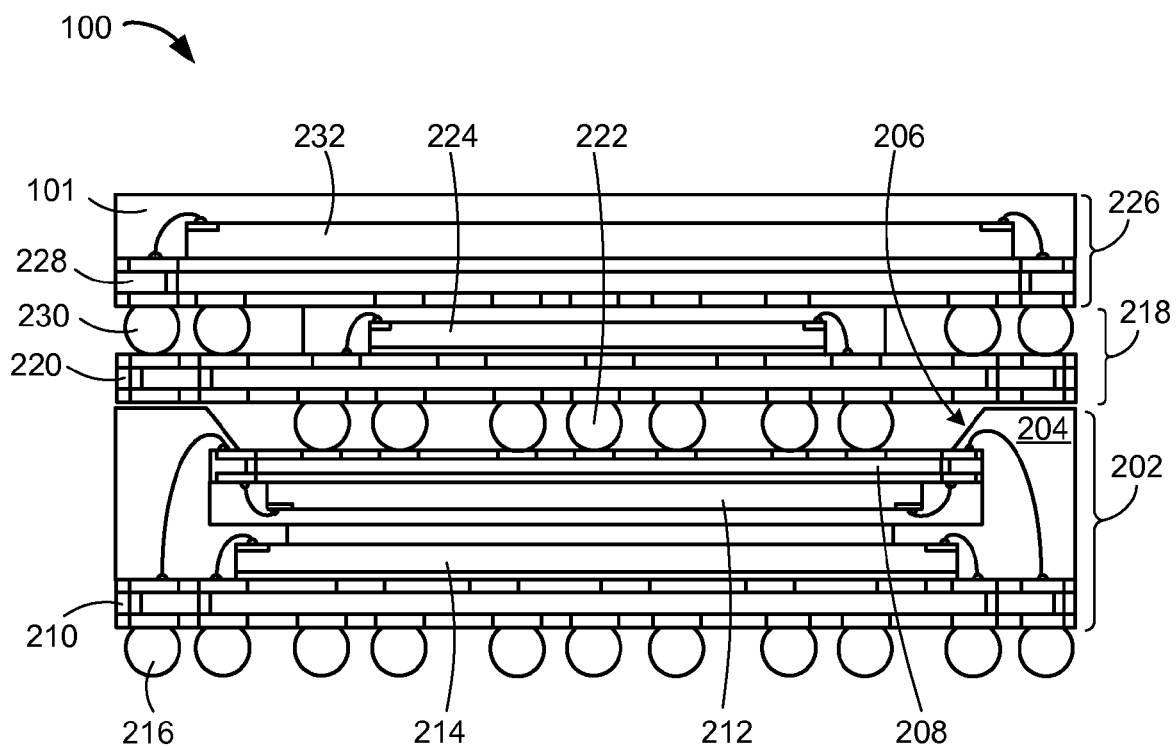
FIG. 2 is a cross-sectional view of the stacked integrated circuit package system along line 2-2 of FIG. 1.

Referring now to FIG. 2, therein is shown a cross-sectional view of the stacked integrated circuit package system 100 along line 2-2 of FIG. 1. The cross-sectional view depicts a base integrated circuit package 202 having a base encapsulation 204, such as cover including an epoxy molding compound, with a cavity 206 therein. A base interposer 208, such as a laminated substrate is exposed by the cavity 206. The base integrated circuit package 202 includes a base package carrier 210. In this example, the cavity 206 is above the base package carrier 210. The base integrated circuit package 202 includes a first base integrated circuit device 212 such as one or more flip chips, wire bonded chips, or packaged integrated circuits.

The first base integrated circuit device 212 can be under the base interposer 208. Optionally, the base integrated circuit package 202 can include additional integrated circuit devices such one or more flip chips, wire bonded chips, or packaged integrated circuits. A second base integrated circuit device 214 can be over the base package carrier 210.

Optionally, an external interconnect 216, such as a solder ball, can attach to the stacked integrated circuit package system 100 for connection to the next system level (not shown), such as a printed circuit board or another integrated circuit package system. In this example, the external interconnect 216 is attached below and to the base package carrier 210. The base package carrier 210 may include other structures (not shown), such as metal traces, metal layers, insulating layers, electrical vias, landing pads, or a combination thereof.

An intermediate integrated circuit package 218 is mounted over the base interposer 208. The intermediate integrated circuit package 218 includes an intermediate package carrier 220 such as a laminated substrate or an interposer. The intermediate package carrier 220 and the base interposer 208 may include other structures (not shown), such as metal traces, metal layers, insulating layers, electrical vias, landing pads, or a combination thereof. Optionally, a base intra-stack interconnect 222, such as a solder ball, forms a base electrical interconnection between the base integrated circuit package 202 and the intermediate integrated circuit package 218. Other examples of the base intra-stack interconnect 222 include column grid arrays, pin interconnects, post interconnects, interconnects formed using folded printed circuit boards (PCBs) or combinations thereof. In this example, the base intra-stack interconnect 222 is mounted over the base interposer 208 and couples the base integrated circuit package 202 to the intermediate integrated circuit package 218 through the intermediate package carrier 220.

It has been discovered that some embodiments of the present invention, such as the stacked integrated circuit package system 100, can provide a stacked integrated circuit package system with reduced profile. For example, the stacked integrated circuit package system 100 includes the base intra-stack interconnect 222, such as a solder ball, formed over the base interposer 208 and disposed in the cavity 206. This configuration can provide the functionality of an interconnected system with a reduced system height.

The intermediate integrated circuit package 218 includes a first intermediate integrated circuit device 224 such as one or more flip chips, wire bonded chips, or packaged integrated circuits. The intermediate integrated circuit package 218 may be or may include a Known Good Package ("KGP") that has been functionally tested. Optionally, the intermediate integrated circuit package 218 can include additional integrated circuit devices flip chips, wire bonded chips, or packaged integrated circuits.

A top integrated circuit package 226 is mounted over the intermediate integrated circuit package 218. The top integrated circuit package 226 includes a top package carrier 228 such as a laminated substrate or an interposer. The top package carrier 228 may include other structures (not shown), such as metal traces, metal layers, insulating layers, electrical vias, landing pads, or a combination thereof. Optionally, an intermediate intra-stack interconnect 230, such as a solder ball, forms an intermediate electrical interconnection between the intermediate integrated circuit package 218 and the top integrated circuit package 226. Other examples of the intermediate intra-stack interconnect 230 include wirebond wires, column grid arrays, pin interconnects, post interconnects, interconnects formed using folded printed circuit boards (PCBs) or combinations thereof.

The top integrated circuit package 226 includes a first top integrated circuit device 232 such as one or more flip chips, wire bonded chips, or packaged integrated circuits. The top integrated circuit package 226 may be or may include a Known Good Package ("KGP") that has been functionally tested. Optionally, the top integrated circuit package 226 can include additional integrated circuit devices flip chips, wire bonded chips, or packaged integrated circuits.

The intermediate integrated circuit package 218 and the top integrated circuit package 226 can include multichip packages, flip chip packages, lead frame base packages, board-on-chip (BOC) packages, system-on-a-package (SIP) packages, package-in-a-package (PiP) packages and any combination thereof. In some examples, the intermediate integrated circuit package 218 and the top integrated circuit package 226 can be assembled together before mounting the intermediate integrated circuit package 218 over the base integrated circuit package 202. Optionally, an assembly including the intermediate integrated circuit package 218 and the top integrated circuit package 226 may be tested before mounting the intermediate integrated circuit package 218 over the base integrated circuit package 202. For example, the intermediate integrated circuit package 218 and the top integrated circuit package 226 may be pre-assembled and tested to produce a Known Good Package ("KGP") including at least two integrated circuit devices (the first intermediate integrated circuit device 224 and the first top integrated circuit device 232). This feature can further reduce manufacturing cost and increase reliability.

For illustrative purposes, the stacked integrated circuit package system 100 is shown with the base integrated circuit package 202, the intermediate integrated circuit package 218, and the top integrated circuit package 226 of the same lateral dimensions. However, it is understood the base integrated circuit package 202, the intermediate integrated circuit package 218, and the top integrated circuit package 226 may have different relative lateral dimensions. Furthermore, the base intra-stack interconnect 222 and the intermediate intra-stack interconnect 230 are both illustrated as solder balls. However, it is understood that the type of interconnect used for the base intra-stack interconnect 222 can be different from the type of interconnect used for the intermediate intra-stack interconnect 230.

Figure 3:
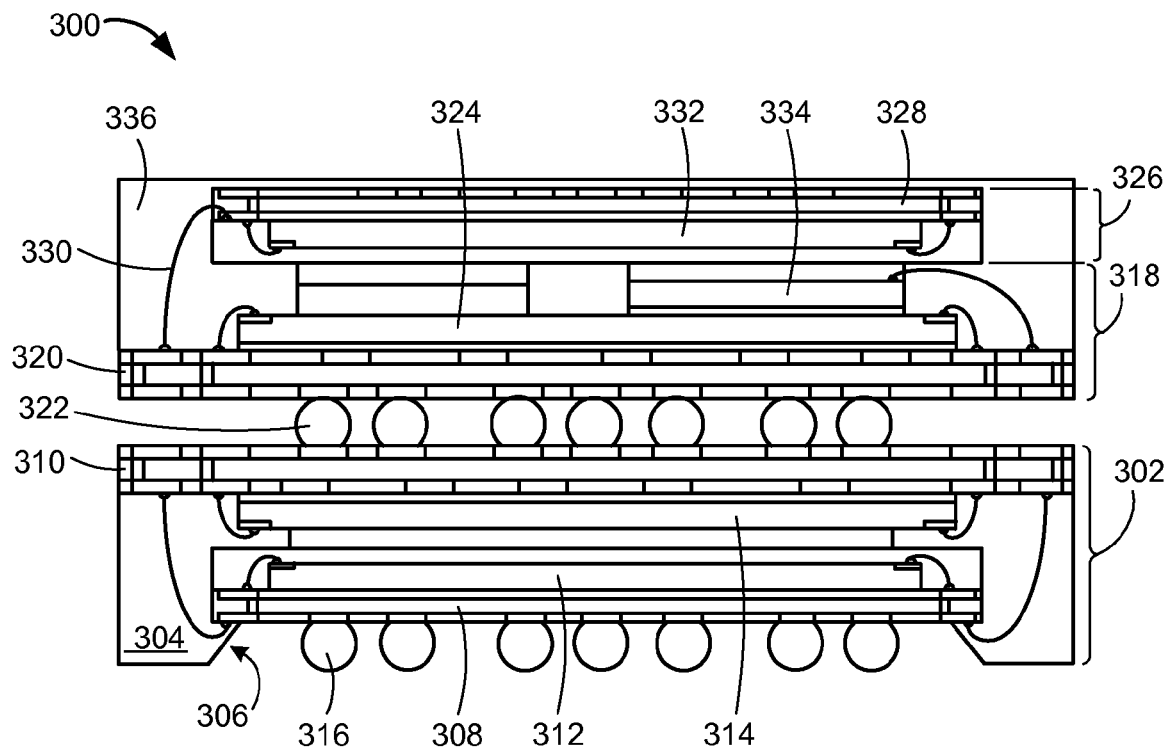
FIG. 3 is a cross-sectional view of a stacked integrated circuit package system exemplified by the top view of FIG. 1 in a second embodiment of the present invention.

Referring now to FIG. 3, therein is shown a cross-sectional view of a stacked integrated circuit package system 300 exemplified by the top view of FIG. 1 in a second embodiment of the present invention. The cross-sectional view depicts a base integrated circuit package 302 having a base encapsulation 304, such as a cover including an epoxy molding compound, with a cavity 306 therein.

A base interposer 308, such as a laminated substrate, is exposed by the cavity 306. The base integrated circuit package 302 includes a base package carrier 310. In this example, the cavity 306 is below the base package carrier 310. The base integrated circuit package 302 includes a first base integrated circuit device 312 such as one or more flip chips, wire bonded chips, or packaged integrated circuits.

The first base integrated circuit device 312 can be over the base interposer 308. Optionally, the base integrated circuit package 302 can include additional integrated circuit devices such one or more flip chips, wire bonded chips, or packaged integrated circuits. A second base integrated circuit device 314 can be under the base package carrier 310. The base integrated circuit package 302 in the stacked integrated circuit package system 300 has the base package carrier 310 over the base interposer 308; this configuration may be referred to as an "upside down" or "inverted" package-on-package (POP) system.

Optionally, an external interconnect 316, such as a solder ball, can attach to the stacked integrated circuit package system 300 for connection to the next system level (not shown), such as a printed circuit board or another integrated circuit package system. In this example, the external interconnect 316 is below the base package carrier 310 and is attached below and to the base interposer 308. The base interposer 308 may include other structures (not shown), such as metal traces, metal layers, insulating layers, electrical vias, landing pads, or a combination thereof.

It has been discovered that some embodiments of the present invention such as the stacked integrated circuit package system 300 provide a stacked integrated circuit package system with reduced profile. For example, the stacked integrated circuit package system 300 includes the external interconnect 316, such as a solder ball, formed under the base interposer 308 and disposed in the cavity 306. This configuration can provide the functionality of an externally interconnectable system with a reduced system height.

An intermediate integrated circuit package 318 is mounted over the base package carrier 310. The intermediate integrated circuit package 318 includes an intermediate package carrier 320 such as a laminated substrate or interposer. Optionally, a base intra-stack interconnect 322, such as a solder ball, forms a base electrical interconnection between the base integrated circuit package 302 and the intermediate integrated circuit package 318. The intermediate package carrier 320 and the base package carrier 310 may include other structures (not shown), such as metal traces, metal layers, insulating layers, electrical vias, landing pads, or a combination thereof. Other examples of the base intra-stack interconnect 322 include column grid arrays, pin interconnects, post interconnects, interconnects formed using folded printed circuit boards (PCBs) or combinations thereof. In this example, the base intra-stack interconnect 322 is mounted over and to the base package carrier 310. The base intra-stack interconnect 322 couples to the intermediate integrated circuit package 318 through the intermediate package carrier 320.

The intermediate integrated circuit package 318 includes a first intermediate integrated circuit device 324 such as one or more flip chips, wire bonded chips, or packaged integrated circuits. The intermediate integrated circuit package 318 may be or may include a Known Good Package ("KGP") that has been functionally tested. Optionally, the intermediate integrated circuit package 318 can include additional integrated circuit devices such as flip chips, wire bonded chips, or packaged integrated circuits. For example, a second intermediate integrated circuit device 334 can be over the intermediate package carrier 320.

A top integrated circuit package 326 is mounted over the intermediate integrated circuit package 318. The top integrated circuit package 326 includes a top package carrier 328 such as a laminated substrate or interposer. The top package carrier 328 may include other structures (not shown), such as metal traces, metal layers, insulating layers, electrical vias, landing pads, or a combination thereof. Optionally, an intermediate intra-stack interconnect 330, such as a wire, wire-bond wire or wire-bond ribbon, forms an intermediate electrical interconnection between the intermediate integrated circuit package 318 and the top integrated circuit package 326. Other examples of the intermediate intra-stack interconnect 330 include solder balls, column grid arrays, pin interconnects, post interconnects, interconnects formed using folded printed circuit boards (PCBs) or combinations thereof.

The top integrated circuit package 326 includes a first top integrated circuit device 332 such as one or more flip chips, wire bonded chips, or packaged integrated circuits. The top integrated circuit package 326 may be or may include a Known Good Package ("KGP") that has been functionally tested. Optionally, the top integrated circuit package 326 can include additional integrated circuit devices flip chips, wire bonded chips, or packaged integrated circuits. In this example, a combination package encapsulation 336 such as a cover including epoxy molding compound, has been formed over the intermediate integrated circuit package 318 and the top integrated circuit package 326. The combination package encapsulation 336 is optional. In this example, the combination package encapsulation 336 completely encapsulates both the intermediate integrated circuit package 318 and the top integrated circuit package 326. However, it is understood that in some embodiments of the current invention, the combination package encapsulation 336 can leave portions of the intermediate integrated circuit package 318 or the top integrated circuit package 326 exposed.

The intermediate integrated circuit package 318 and the top integrated circuit package 326 can include multichip packages, flip chip packages, lead frame base packages, board-on-chip (BOC) packages, system-on-a-package (SIP) packages, package-in-a-package (PiP) packages and any combination thereof. In some examples, the intermediate integrated circuit package 318 and the top integrated circuit package 326 can be assembled together before mounting the intermediate integrated circuit package 318 over the base integrated circuit package 302. Optionally, an assembly including the intermediate integrated circuit package 318 and the top integrated circuit package 326 may be tested before mounting the intermediate integrated circuit package 318 over the base integrated circuit package 302. For example, the intermediate integrated circuit package 318 and the top integrated circuit package 326 may be pre-assembled and tested to produce a Known Good Package ("KGP") including at least two integrated circuit devices (the first intermediate integrated circuit device 324 and the first top integrated circuit device 332). This feature can further reduce manufacturing cost and increase reliability. Optionally, the combination package encapsulation 336 may be formed over an assembly including the intermediate integrated circuit package 318 and the top integrated circuit package 326 before mounting the intermediate integrated circuit package 318 over the base integrated circuit package 302.

For illustrative purposes, the stacked integrated circuit package system 300 is shown with the base package carrier 310 and the intermediate package carrier 320 of the same dimensions. However, it is understood the base package carrier 310 and the intermediate package carrier 320 may have different dimensions.

Figure 4:
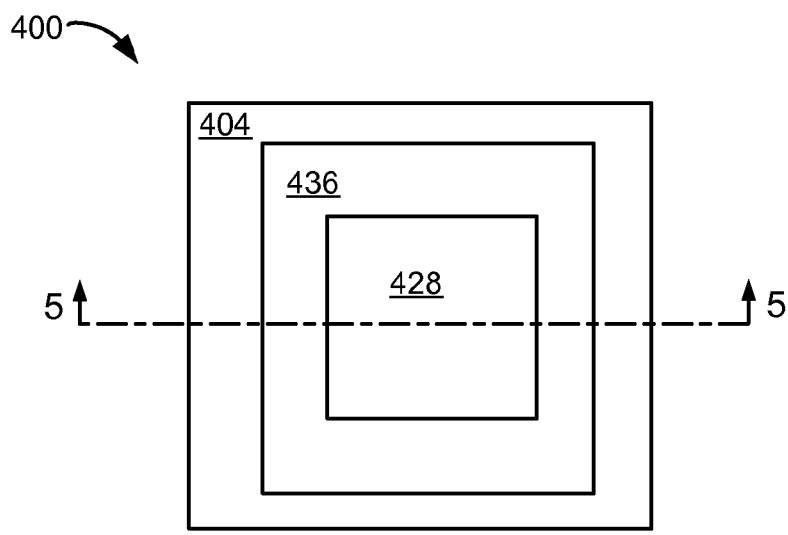
FIG. 4 is a top view of a stacked integrated circuit package system in a third embodiment of the present invention.

Referring now to FIG. 4, therein is shown a top view of a stacked integrated circuit package system 400 in a third embodiment of the present invention. The top view depicts a base encapsulation 404 and a combination package encapsulation 436, such as a cover including an epoxy molding compound. The combination package encapsulation 436 is optional. A top package carrier 428 such as a laminated substrate or interposer, is exposed.

Figure 5:
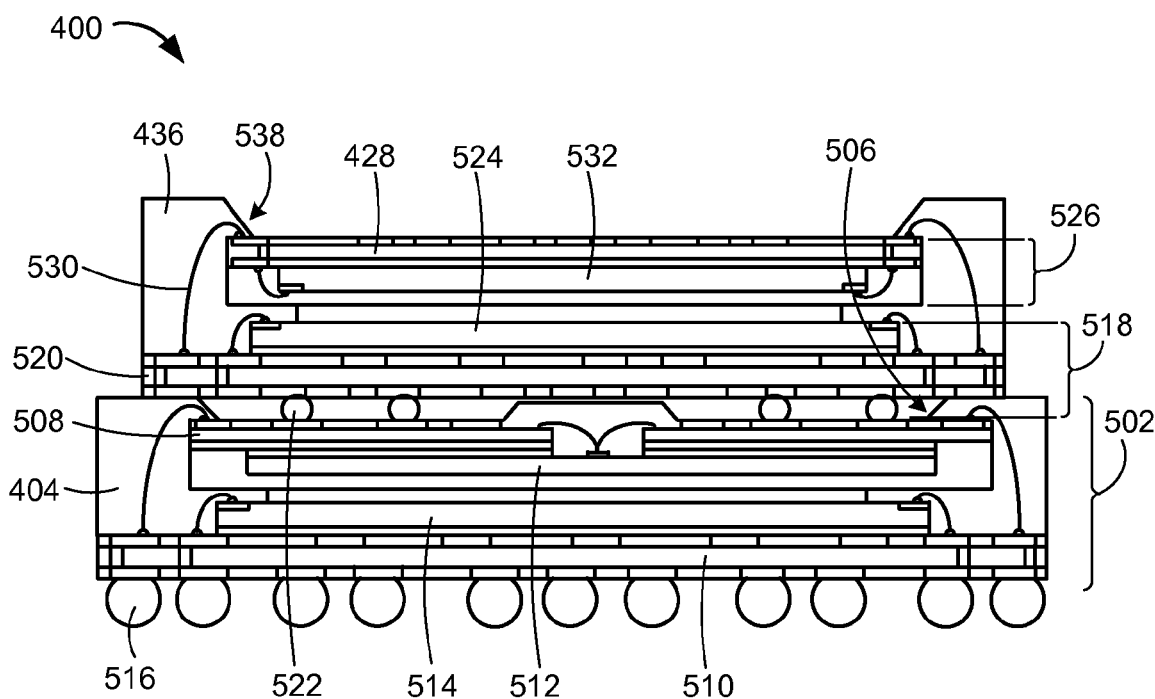
FIG. 5 is a cross-sectional view of the stacked integrated circuit package system along line 5-5 of FIG. 4.

Referring now to FIG. 5, therein is shown a cross-sectional view of the stacked integrated circuit package system 400 along line 5-5 of FIG. 4. The cross-sectional view depicts a base integrated circuit package 502 and the base encapsulation 404 such as a cover including an epoxy molding compound, with a cavity 506 therein.

A base interposer 508 is exposed by the cavity 506. The base integrated circuit package 502 includes a base package carrier 510. In this example, the cavity 506 is above the base package carrier 510. The base integrated circuit package 502 includes a first base integrated circuit device 512 such as one or more flip chips, wire bonded chips, or packaged integrated circuits. The first base integrated circuit device 512 can be under the base interposer 508.

Optionally, the base integrated circuit package 502 can include additional integrated circuit devices such one or more flip chips, wire bonded chips, or packaged integrated circuits. A second base integrated circuit device 514 can be over the base package carrier 510. Optionally, an external interconnect 516 can attach to the stacked integrated circuit package system 400 for connection to the next system level (not shown), such as a printed circuit board or another integrated circuit package system. In this example, the external interconnect 516 is attached below and to the base package carrier 510. The base package carrier 510 may include other structures (not shown), such as metal traces, metal layers, insulating layers, electrical vias, landing pads, or a combination thereof.

An intermediate integrated circuit package 518 is mounted over the base interposer 508. The intermediate integrated circuit package 518 includes an intermediate package carrier 520 such as a laminated substrate or interposer. The intermediate package carrier 520 and the base interposer 508 may include other structures (not shown), such as metal traces, metal layers, insulating layers, electrical vias, landing pads, or a combination thereof. Optionally, a base intra-stack interconnect 522, such as a solder ball, forms a base electrical interconnection between the base integrated circuit package 502 and the intermediate integrated circuit package 518. Other examples of the base intra-stack interconnect include column grid arrays, pin interconnects, post interconnects, interconnects formed using folded printed circuit boards (PCBs) or combinations thereof. In this example, the base intra-stack interconnect 522 is mounted over the base interposer 508. The base intra-stack interconnect 522 can couple to the intermediate integrated circuit package 518 through the intermediate package carrier 520.

It has been discovered that some embodiments of the present invention such as the stacked integrated circuit package system 400 provide a stacked integrated circuit package system with reduced profile. For example, the stacked integrated circuit package system 400 includes the base intra-stack interconnect 522, such as a solder ball, formed over the base interposer 508 and disposed in the cavity 506. This configuration can provide the functionality of an interconnected system with a reduced system height.

The intermediate integrated circuit package 518 includes a first intermediate integrated circuit device 524 such as one or more flip chips, wire bonded chips, or packaged integrated circuits. The intermediate integrated circuit package 518 may be or may include a Known Good Package ("KGP") that has been functionally tested. Optionally, the intermediate integrated circuit package 518 can include additional integrated circuit devices flip chips, wire bonded chips, or packaged integrated circuits.

A top integrated circuit package 526 is mounted over the intermediate integrated circuit package 518. The top integrated circuit package 526 includes the top package carrier 428 such as a laminated substrate or interposer. The top package carrier 428 may include other structures (not shown), such as metal traces, metal layers, insulating layers, electrical vias, landing pads, or a combination thereof. Optionally, an intermediate intra-stack interconnect 530, such as a wire, wire-bond wire or wire-bond ribbon, forms an intermediate electrical interconnection between the intermediate integrated circuit package 518 and the top integrated circuit package 526. Other examples of the intermediate intra-stack interconnect 530 include solder balls, column grid arrays, pin interconnects, post interconnects, interconnects formed using folded printed circuit boards (PCBs) or combinations thereof.

The top integrated circuit package 526 includes a first top integrated circuit device 532 such as one or more flip chips, wire bonded chips, or packaged integrated circuits. The top integrated circuit package 526 may be or may include a Known Good Package ("KGP") that has been functionally tested. Optionally, the top integrated circuit package 526 can include additional integrated circuit devices flip chips, wire bonded chips, or packaged integrated circuits.

In this example, the combination package encapsulation 436 such as a cover including epoxy molding compound, has been formed over the intermediate integrated circuit package 518 and the top integrated circuit package 526. The combination package encapsulation 436 is optional. In this example, the combination package encapsulation 436 includes a top cavity 538. The combination package encapsulation 436 encapsulates both the intermediate integrated circuit package 518 and the top integrated circuit package 526, leaving the top package carrier 428 exposed. However, it is understood that in some embodiments of the current invention, the combination package encapsulation 436 can fully encapsulate the intermediate integrated circuit package 518 and the top integrated circuit package 526.

The intermediate integrated circuit package 518 and the top integrated circuit package 526 can include multichip packages, flip chip packages, lead frame base packages, board-on-chip (BOC) packages, system-on-a-package (SIP) packages, package-in-a-package (PiP) packages and any combination thereof. In some examples, the intermediate integrated circuit package 518 and the top integrated circuit package 526 can be assembled together before mounting the intermediate integrated circuit package 518 over the base integrated circuit package 502. Optionally, an assembly including the intermediate integrated circuit package 518 and the top integrated circuit package 526 may be tested before mounting the intermediate integrated circuit package 518 over the base integrated circuit package 502. For example, the intermediate integrated circuit package 518 and the top integrated circuit package 526 may be pre-assembled and tested to produce a Known Good Package ("KGP") including at least two integrated circuit devices (the first intermediate integrated circuit device 524 and the first top integrated circuit device 532). This feature can further reduce manufacturing cost and increase reliability. Optionally, the combination package encapsulation 436 may be formed over an assembly including the intermediate integrated circuit package 518 and the top integrated circuit package 526 before mounting the intermediate integrated circuit package 518 over the base integrated circuit package 502.

Figure 6:
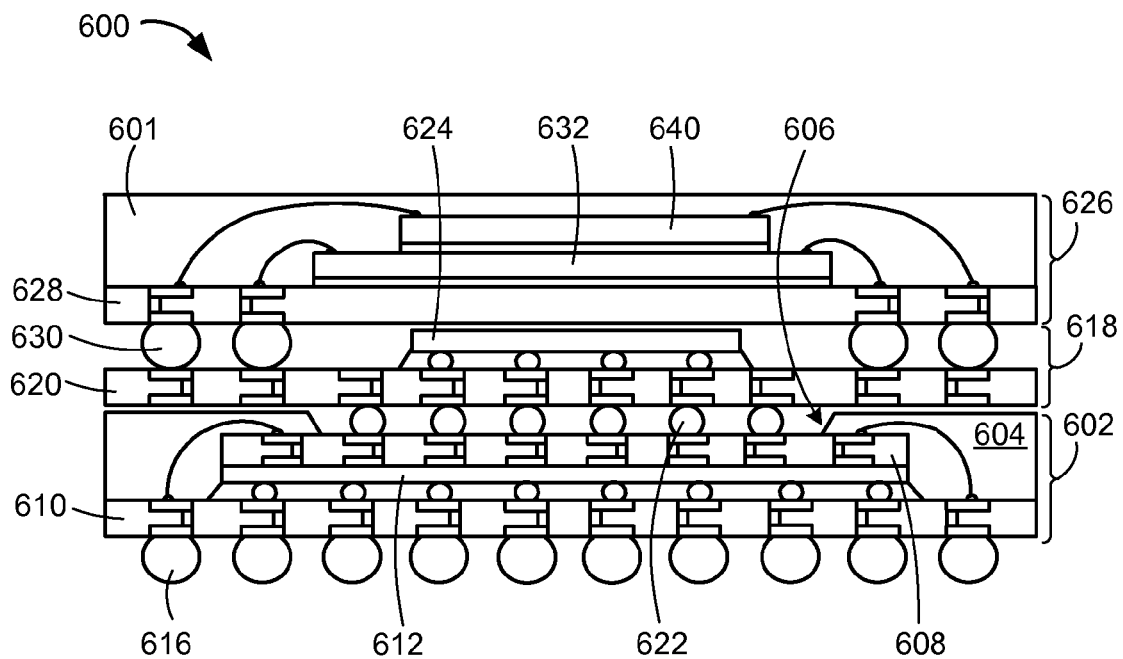
FIG. 6 is a cross-sectional view of a stacked integrated circuit package system exemplified by the top view of FIG. 1 in a fourth embodiment of the present invention.

Referring now to FIG. 6, therein is shown a cross-sectional view of a stacked integrated circuit package system 600 exemplified by the top view of FIG. 1 in a fourth embodiment of the present invention. The cross-sectional view depicts a base integrated circuit package 602 having a base encapsulation 604, such as a cover including an epoxy molding compound, with a cavity 606 therein.

A base interposer 608, such as a laminated substrate, is exposed by the cavity 606. The base integrated circuit package 602 includes a base package carrier 610, such as a laminated substrate. In this example, the cavity 606 is above the base package carrier 610. The base integrated circuit package 602 includes a first base integrated circuit device 612 such as one or more flip chips, wire bonded chips, or packaged integrated circuits. The first base integrated circuit device 612 can be mounted over the base package carrier 610. Optionally, the base integrated circuit package 602 can include additional integrated circuit devices such one or more flip chips, wire bonded chips, or packaged integrated circuits.

Optionally, an external interconnect 616 can attach to the stacked integrated circuit package system 600 for connection to the next system level (not shown), such as a printed circuit board or another integrated circuit package system. The base package carrier 610 may include other structures (not shown), such as metal traces, metal layers, insulating layers, electrical vias, landing pads, or a combination thereof. In this example, the external interconnect 616 is attached below and to the base package carrier 610.

An intermediate integrated circuit package 618 is mounted over the base interposer 608. The intermediate integrated circuit package 618 includes an intermediate package carrier 620 such as a laminated substrate or interposer. The intermediate package carrier 620 and the base interposer 608 may include other structures (not shown), such as metal traces, metal layers, insulating layers, electrical vias, landing pads, or a combination thereof. Optionally, a base intra-stack interconnect 622, such as a solder ball, forms a base electrical interconnection between the base integrated circuit package 602 and the intermediate integrated circuit package 618. Other examples of the base intra-stack interconnect 622 include column grid arrays, pin interconnects, post interconnects, interconnects formed using folded printed circuit boards (PCBs) or combinations thereof. In this example, the base intra-stack interconnect 622 is mounted over the base interposer 608. The base intra-stack interconnect 622 couples the base integrated circuit package 602 to the intermediate integrated circuit package 618 through the intermediate package carrier 620.

It has been discovered that some embodiments of the present invention such as the stacked integrated circuit package system 600 provide a stacked integrated circuit package system with reduced profile. For example, the stacked integrated circuit package system 600 includes the base intra-stack interconnect 622, such as a solder ball, formed over the base interposer 608 and disposed in the cavity 606. This configuration can provide the functionality of an interconnected system with a reduced system height.

The intermediate integrated circuit package 618 includes a first intermediate integrated circuit device 624 such as one or more flip chips, wire bonded chips, or packaged integrated circuits. The intermediate integrated circuit package 618 may be or may include a Known Good Package ("KGP") that has been functionally tested. Optionally, the intermediate integrated circuit package 618 can include additional integrated circuit devices flip chips, wire bonded chips, or packaged integrated circuits.

A top integrated circuit package 626 is mounted over the intermediate integrated circuit package 618. The top integrated circuit package 626 includes a top package carrier 628 such as a laminated substrate or interposer. The top package carrier 628 may include other structures (not shown), such as metal traces, metal layers, insulating layers, electrical vias, landing pads, or a combination thereof. Optionally, an intermediate intra-stack interconnect 630, such as a solder ball, forms an intermediate electrical interconnection between the intermediate integrated circuit package 618 and the top integrated circuit package 626. Other examples of the intermediate intra-stack interconnect 630 include wirebond wires, column grid arrays, pin interconnects, post interconnects, interconnects formed using folded printed circuit boards (PCBs) or combinations thereof.

The top integrated circuit package 626 includes a first top integrated circuit device 632 such as one or more flip chips, wire bonded chips, or packaged integrated circuits. The top integrated circuit package 626 may be a Known Good Package ("KGP") that has been functionally tested. Optionally, the top integrated circuit package 626 can include additional integrated circuit devices flip chips, wire bonded chips, or packaged integrated circuits. A second top integrated circuit device 640 can be over the top package carrier 628. Optionally, a top package encapsulation 601 such as a cover including an epoxy molding compound, may be formed over the top integrated circuit package 626.

The intermediate integrated circuit package 618 and the top integrated circuit package 626 can include multichip packages, flip chip packages, lead frame base packages, board-on-chip (BOC) packages, system-on-a-package (SIP) packages, package-in-a-package (PiP) packages and any combination thereof. In some examples, the intermediate integrated circuit package 618 and the top integrated circuit package 626 can be assembled together before mounting the intermediate integrated circuit package 618 over the base integrated circuit package 602. Optionally, an assembly including the intermediate integrated circuit package 618 and the top integrated circuit package 626 may be tested before mounting the intermediate integrated circuit package 618 over the base integrated circuit package 602. For example, the intermediate integrated circuit package 618 and the top integrated circuit package 626 may be pre-assembled and tested to produce a Known Good Package ("KGP") including at least two integrated circuit devices (the first intermediate integrated circuit device 624 and the first top integrated circuit device 632). This feature can further reduce manufacturing cost and increase reliability.

It has been discovered that the present invention provides a compact stacked integrated circuit package system. The present invention can provide improved yields due to the modular nature of the system. The base integrated circuit package, the intermediate integrated circuit package, and the top integrated circuit package may be independently tested or characterized before assembly in a stacked integrated circuit package system according to the current invention.

It has been discovered that the present invention provides a stacked integrated circuit package system with excellent thermal management properties. For example, the gaps in the current invention such as the cavity can provide air flow channels for improved heat dissipation.

Yet another important aspect of the present invention is that the present invention can provide a system capable of complex internal interconnections. Some embodiments of the current invention include a base package carrier, a base interposer, an intermediate package carrier and a top package carrier including structures such as metal traces, metal layers, insulating layers, electrical vias, landing pads, or a combination thereof for providing complex interconnections. When implemented in conjunction with base intra-stack interconnects and intermediate intra-stack interconnects, the present invention can enable the implementation of complex interconnected systems including three or more integrated circuit devices with a small footprint.

Figure 7:
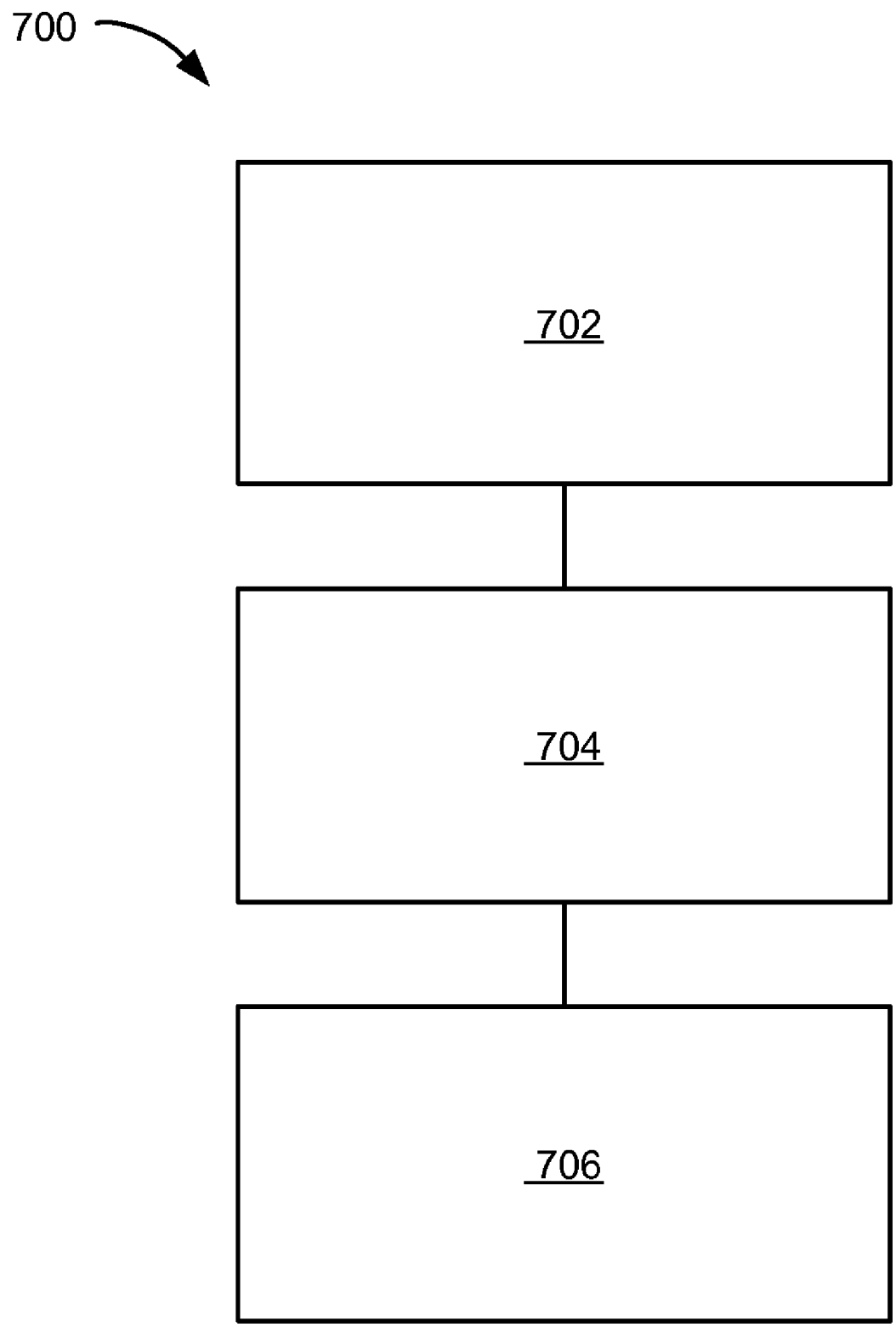
FIG. 7 is a flow chart of a stacked integrated circuit package system for manufacturing of the stacked integrated circuit package system in an embodiment of the present invention.

Referring now to FIG. 7, therein is shown a flow chart of a stacked integrated circuit package system 700 for manufacturing of the stacked integrated circuit package system 100 in an embodiment of the present invention. The system 700 includes providing a base integrated circuit package having a base encapsulation with a cavity therein and a base interposer exposed by the cavity in a block 702; mounting an intermediate integrated circuit package over the base interposer in a block 704; and mounting a top integrated circuit package over the intermediate integrated circuit package in a block 706.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package system of the present invention furnishes important and heretofore unknown and unavailable solutions, capabilities, and functional aspects for improving yield, increasing reliability, and reducing cost of circuit system. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method for manufacturing a stacked integrated package comprising:
    providing a base integrated circuit package having a base encapsulation with a cavity therein and a base interposer exposed by the cavity;
    mounting an intermediate integrated circuit package over the base interposer;
    mounting a top integrated circuit package over the intermediate integrated circuit package; and
    forming a base intra-stack interconnect between the base integrated circuit package and the intermediate integrated circuit package.

2. A method for manufacturing a stacked integrated package as claimed in claim 1 further comprising forming an external interconnect below the base interposer.

3. A method for manufacturing a stacked integrated package as claimed in claim 1 wherein forming the base intra-stack interconnect between the base integrated circuit package and the intermediate integrated circuit package includes forming the base intra-stack interconnect over the base interposer and in the cavity.

4. A method for manufacturing a stacked integrated package as claimed in claim 1 wherein forming the base intra-stack interconnect between the base integrated circuit package and the intermediate integrated circuit package includes coupling the base interposer to the intermediate integrated circuit package.

5. A method for manufacturing a stacked integrated package as claimed in claim 1 wherein:
    providing a base integrated circuit package having a base encapsulation with a cavity therein and a base interposer exposed by the cavity includes providing a base package carrier; and
    forming a base intra-stack interconnect between the base integrated circuit package and the intermediate integrated circuit package includes coupling the base package carrier to the intermediate integrated circuit package.

* * * * *